(12) United States Patent
Danner et al.

(10) Patent No.: US 12,222,744 B2
(45) Date of Patent: Feb. 11, 2025

(54) OPERATING ELEMENT FOR A MOTOR VEHICLE

(71) Applicant: Bayerische Motoren Werke Aktiengesellschaft, Munich (DE)

(72) Inventors: Florian Danner, Unterschleissheim (DE); Gabriel Hairer, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 18/255,054

(22) PCT Filed: Nov. 4, 2021

(86) PCT No.: PCT/EP2021/080573
§ 371 (c)(1),
(2) Date: May 30, 2023

(87) PCT Pub. No.: WO2022/117272
PCT Pub. Date: Jun. 9, 2022

(65) Prior Publication Data
US 2024/0004416 A1 Jan. 4, 2024

(30) Foreign Application Priority Data
Dec. 2, 2020 (DE) ...................... 10 2020 131 902.9

(51) Int. Cl.
*G06F 3/0354* (2013.01)
*B60Q 9/00* (2006.01)
(Continued)

(52) U.S. Cl.
CPC ........... *G05G 1/08* (2013.01); *G06F 3/03547* (2013.01); *G06F 3/0362* (2013.01); *H03K 17/96* (2013.01);
(Continued)

(58) Field of Classification Search
CPC ........... H03K 2217/96066; H03K 2217/94073
See application file for complete search history.

(56) References Cited

U.S. PATENT DOCUMENTS

2007/0057922 A1* 3/2007 Schultz ................ G06F 3/03547
345/173
2009/0195659 A1* 8/2009 Nagata ................ G06F 3/03547
345/173
(Continued)

FOREIGN PATENT DOCUMENTS

DE 10 2004 007 055 A1 9/2005
DE 10 2008 041 625 A1 3/2010
(Continued)

OTHER PUBLICATIONS

PCT/EP2021/080573, International Search Report dated Feb. 1, 2022 (Two (2) pages).
(Continued)

*Primary Examiner* — Daniel D Yabut
(74) *Attorney, Agent, or Firm* — Crowell & Moring LLP

(57) ABSTRACT

An operating element to be installed in a center console of a motor vehicle includes at least two planar elements which are at least partially touch-sensitive such that an operator can trigger a function via a touch with a hand of the operator or at least one finger of the operator and a rotary element disposed between the at least two planar elements where a cylindrical surface of the rotary element is touch-sensitive.

5 Claims, 3 Drawing Sheets

(51) Int. Cl.
*G05G 1/08* (2006.01)
*G06F 3/0362* (2013.01)
*H03K 17/96* (2006.01)
*B60Q 5/00* (2006.01)
*G05G 5/03* (2008.04)

(52) U.S. Cl.
CPC ............... *B60Q 5/005* (2013.01); *B60Q 9/00* (2013.01); *G05G 5/03* (2013.01); *G05G 2505/00* (2013.01); *H03K 2217/96066* (2013.01)

(56) References Cited

U.S. PATENT DOCUMENTS

| | | | | |
|---|---|---|---|---|
| 2016/0137064 | A1* | 5/2016 | Min | G06F 3/0488 345/156 |
| 2016/0179366 | A1* | 6/2016 | Min | G06F 3/04883 715/863 |
| 2016/0378200 | A1* | 12/2016 | Lee | G06F 3/04883 345/158 |
| 2017/0024117 | A1* | 1/2017 | Hong | G06F 40/166 |
| 2017/0108946 | A1 | 4/2017 | Nishida | |
| 2017/0147105 | A1* | 5/2017 | Kwon | G06F 3/041 |
| 2018/0081452 | A1 | 3/2018 | Min et al. | |
| 2018/0178597 | A1* | 6/2018 | Min | B60K 35/10 |
| 2019/0204951 | A1* | 7/2019 | Joo | G06F 3/0443 |
| 2019/0210458 | A1* | 7/2019 | Harris | F16H 59/12 |
| 2019/0383386 | A1* | 12/2019 | Harris | F16H 59/0217 |

FOREIGN PATENT DOCUMENTS

| | | |
|---|---|---|
| DE | 10 2012 206 661 A1 | 10/2013 |
| DE | 10 2016 206 719 A1 | 11/2016 |
| DE | 11 2015 002 578 T5 | 4/2017 |
| DE | 10 2016 222 382 A1 | 5/2017 |
| DE | 10 2017 218 506 A1 | 4/2019 |
| KR | 20200063514 A * | 6/2020 |
| WO | WO-2015155973 A1 * | 10/2015 ......... B60R 11/0264 |

OTHER PUBLICATIONS

German Search Report issued in German application No. 10 2020 131 902.9 dated Aug. 5, 2021, with Statement of Relevancy (Seven (7) pages).

* cited by examiner

OPERATING ELEMENT FOR A MOTOR VEHICLE

BACKGROUND AND SUMMARY OF THE INVENTION

The invention relates to an operating element to be installed in a center console of a motor vehicle.

With respect to the technical environment, reference is made, for example, to German published application DE 10 2017 218 506 A1, from which a device, a system, and a method for operating a graphic user interface are known. A device, a system, and a method for operating a graphic user interface in a motor vehicle are disclosed. A touch-sensitive surface of a three-dimensional, convex input body is configured to generate input signals which characterize one or more locations at which the surface thereof is touched, in particular by a hand and preferably by one or more figures. Moreover, a control device is configured to conclude a touch pattern on the surface of the input body on the basis of the input signals and to generate a control signal to control the graphic user interface in accordance with the touch pattern.

An operating element for a display device in a means of transportation is also known from German published application DE 10 2008 041 625 A1. An operating element for a display device in a means of transportation is described, wherein the operating element is spatially separated from the display device. The operating element includes a single touch-sensitive coordinate input device, wherein multiple input surfaces are formed on the coordinate input device. The input surfaces are spatially separated from one another in this case by haptically perceptible partitions.

German published application DE 10 2012 206 661 A1, from which the present invention originates, also relates to an operating element for a motor vehicle. An operating element for a motor vehicle is described, consisting of a planar element which is made at least partially touch-sensitive, so that an operator can trigger a provided function via a touch with the hand. A device for generating a perceptible stimulation is associated with the planar element for this purpose, so that the operator can establish a successful function triggering on the basis of this stimulation.

The present design trend in the interior of motor vehicles, closed, flush surfaces and the mushroom-shaped turn-press-tilt controller having touch input, such as, e.g., the iDrive system from BMW, or the MMI system from Audi, or the CO-MAND system from Daimler, are contradictory with respect to design. The known controllers are therefore not an option for future motor vehicles having modern design and a pure surface-integrated touch input (analogous to a CE device) is not satisfactorily operable during travel in the dynamic range.

The object of the present invention is to integrate a turn-press-tilt controller so it is also visually modern and appealing in the surface of a center console of a motor vehicle while maintaining the good ergonomics for the operation.

According to the invention, an operating element is described which represents the fusion of the learned and known turn-press-tilt operation in a modern, surface-integrated implementation. Due to the design according to the invention of the operating element, this can be combined with modern interior design of motor vehicles without the driver having to adapt to the operation in the operation with respect to conventional operating elements.

The embodiment where the rotary element is formed by a recess in the operating element, enables cost-effective manufacturing of the operating element. Moreover, the level of ergonomics is additionally increased due to the overlap of the palm rest and the rotary element.

The embodiment where the recess includes a circumferential edge, enables a visually stimulating integration of the operating element in the center console of the motor vehicle. The driver of the motor vehicle simultaneously haptically experiences the spatial boundaries of the operating element during the operation of the operating element.

The embodiment where the rotary element merges into a palm rest, improves the ergonomics and the operating friendliness of the operating element.

The ergonomics are subsequently improved in that an upper surface of the rotary element and a surface of the palm rest have a height distance of less than 15 mm according to claim 5.

Easier operation of the operating element is achieved where the recess has a depth between 5 mm and 25 mm.

The embodiment where the upper surface of the rotary element is made touch-sensitive, enables the representation of a touch function for the operating element by one or more fingers.

The embodiment where the rotary element is formed cylindrically at a transition to the palm rest between 180° and 300°, is completely sufficient for the typical operation of the rotary element, since a 360° formation, as is known from the prior art, is not necessary.

The embodiment where the operating element generates optical or acoustic or haptic feedback after a successful touch, increases the level of comfort in the operation of the operating element.

According to the invention, an operating element is described which represents the fusion of the learned and known turn-press-tilt operation including touch operation in a modern, surface-integrated implementation. A rotary actuator appearance of a fixed, surface-integrated element, the rotary element, is selected as an exemplary embodiment for the recognition value. The turn-press-tilt operation is recognized by means of purely electrical sensing (for example capacitively, optically, or force-sensitively). The operating element is on the same Z level (vertical axis) in the rear area with the center console and follows a ramp-like depression, the recess, along the rotary element having rotary actuator appearance at a level which is haptically perceptible in an ergonomically favorable manner (for example −5 mm to −25 mm). The circumferential grip area is shrunken here from originally 360° to a sufficient 180° to 300°. In this exemplary embodiment, the recess is also to be formed in design technology in the center console via a step jump.

As a further exemplary embodiment, it is possible to implement the rotary actuator appearance via a partially circumferential grip area, the circumferential edge. This provides the advantage that the center console can still be made flat. The exemplary embodiments can be constructed like icons with cover materials, such as, e.g., glass or wood. As a further highlight, it is conceivable to visually stage the virtual rotary movement of the rotary element.

The invention is explained in more detail hereinafter on the basis of four figures.

DETAILED DESCRIPTION OF THE DRAWINGS

The same reference signs apply in FIGS. 1 to 4 hereinafter for the same components.

Figure 1:
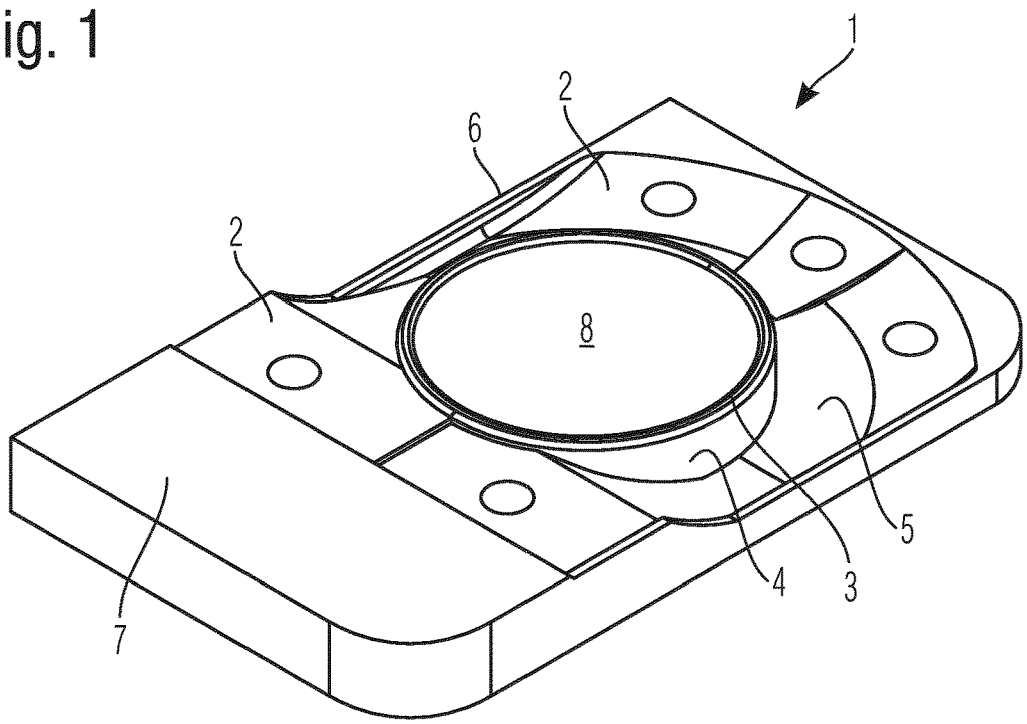
FIG. 1 shows a top view of a three-dimensionally illustrated operating element.

FIG. 1 shows a top view of a three-dimensionally illustrated first exemplary embodiment according to the invention of an operating element 1. The operating element 1 is provided to be installed in a center console (not shown) of a motor vehicle (also not shown).

The operating element 1 consists of at least two planar elements 2, which are made at least partially touch-sensitive by electric sensors. In the present exemplary embodiment, five planar elements 2 are provided, of which only two are numbered. Each of the five planar elements 2 includes a central, unnumbered touch point, represented by a circle. The planar elements 2 are used so that an operator can trigger a provided function via a touch with the hand or at least one finger. Examples of a function are, for example, operating a navigation device, a telephone, or an entertainment system.

According to the invention, a planar element designed as a cylindrical, fixed rotary element 3 is arranged between the five planar elements 2, wherein a cylindrical surface 4 of the rotary element 3 is made touch-sensitive, for example by a capacitive sensor or an optical sensor or a force-sensitive sensor, analogously to the planar elements 2. With the aid of these sensors, a rotation of the rotary element 3 can be sensed, without rotating the rotary element 3 itself. The rotary element 3 is represented by a recess 5 in the operating element 1.

Furthermore, the present exemplary embodiment includes a circumferential edge 6, which encloses the recess 5. The operating field of the operating element 1 can thus be haptically recognized without having to look at the operating element 1.

For particularly good ergonomics, the rotary element 3 merges in this exemplary embodiment counter to a direction of travel of the motor vehicle into a palm rest 7. An upper surface of the rotary element 8 and a surface of the palm rest 7 preferably have between 5 mm and 15 mm height difference for simple and ergonomic operation of the operating element 1.

Furthermore, the recess 5 preferably has a depth between 5 mm and 25 mm. This is a depth range which implements pleasantly haptic operation of the rotary element 3.

In one preferred embodiment, the upper surface of the rotary element 8 is also made touch-sensitive, so that a touch function can be represented, which can be input via single-finger and/or multi-finger gestures.

In relation to the known prior art, the rotary element 3 has a cylindrical surface 4 at a transition to the palm rest 7 between 180° and 300°, which is completely sufficient for normal operation in place of the typical 360° formation, i.e., for a fully cylindrical rotary element.

In a further particularly preferred embodiment, the operating element 1 generates optic or acoustic or haptic feedback or a combination thereof after successful operation.

For example, glass, wood, or plastics, as well as finely processed metal surfaces, such as, e.g., brushed aluminum or brass or stainless steel, are suitable as surface materials for the operating element 1 according to the invention.

Figure 2:
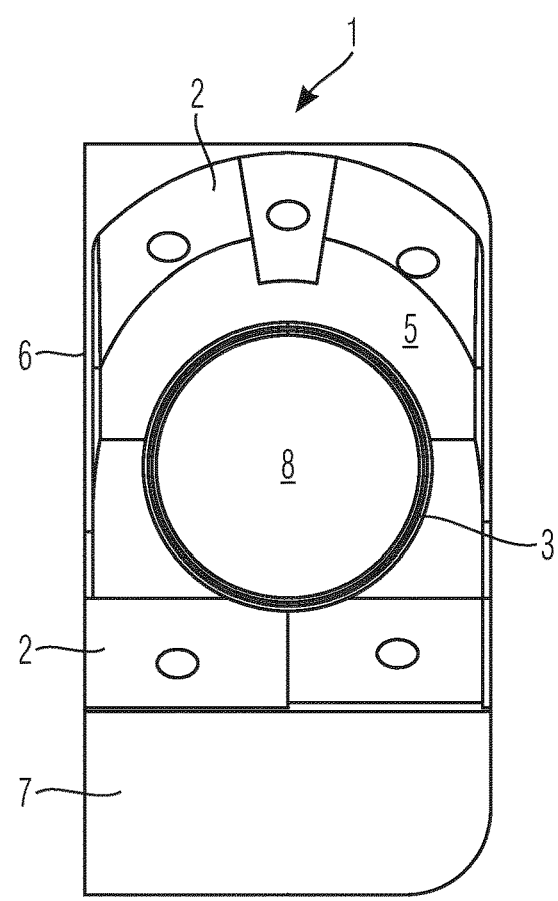
FIG. 2 shows a top view of the operating element according to the invention.

FIG. 2 shows a top view of the operating element 1 according to the invention for the installation in the center console (not shown) of the motor vehicle. All of the statements on FIG. 1 apply.

Figure 3:
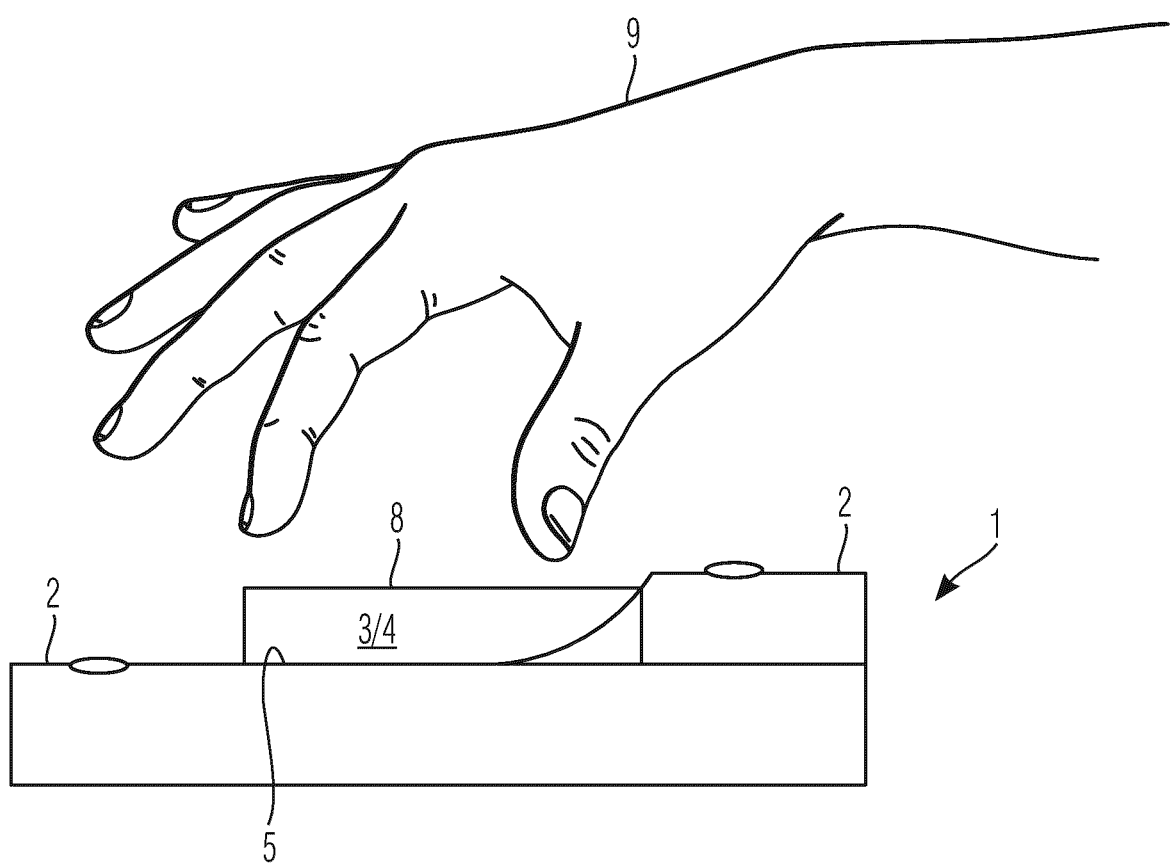
FIG. 3 shows a side view of a second exemplary embodiment.

FIG. 3 shows a side view of a second exemplary embodiment according to the invention without palm rest 7. The operating element 1 is again apparent, having two touch-sensitive planar elements 2, as well as the touch-sensitive rotary element 3 and its touch-sensitive, cylindrical surface 4. It is clearly recognizable how the rotary element 3 is formed by the recess 5 in the operating element 1. As already mentioned, the operating element 1 can trigger a provided function via a touch with a hand 9 or at least one finger. In this first exemplary embodiment, the operating element 1 does not have a circumferential edge 6, but precisely like the second exemplary embodiment can be installed depressed and horizontally in parallel by the integration in the enclosing center console. In the depressed installation method, a further possibility of the integration in a center console is provided of integrating a seamless surface by closing a cover and thus represents an additional exemplary embodiment.

Figure 4:
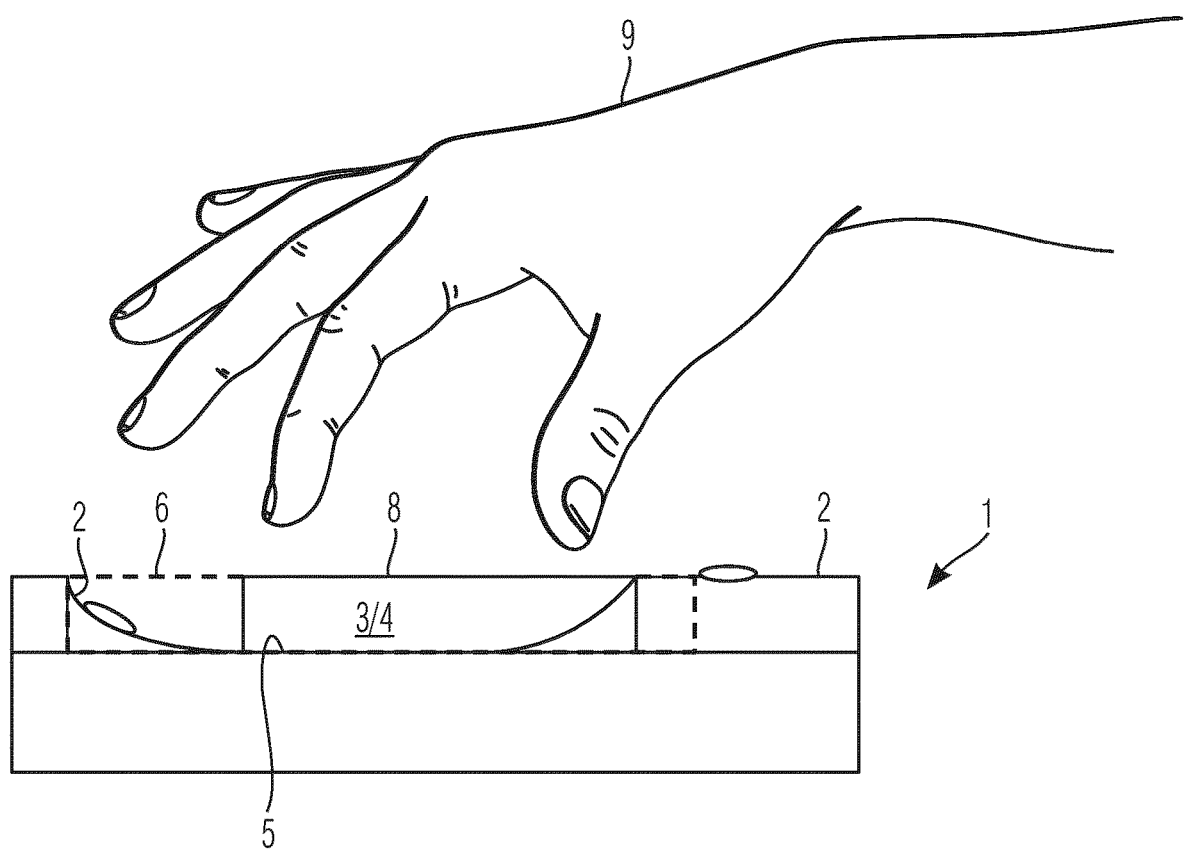
FIG. 4 shows a side view of a third exemplary embodiment.

FIG. 4 shows a third exemplary embodiment of the operating element 1 according to the invention, also without the palm rest 7. In contrast to FIG. 3, the operating element 1 in FIG. 4 has a circumferential edge 6. This circumferential edge 6 can also be made only partially circumferential. Due to this circumferential edge 6, the planar elements 2 can be arranged in the front area so that they can be reached better ergonomically and it is thus less necessary to look away from the road during the operation. A further exemplary embodiment of the planar elements 2 in the front area is represented by the differing elevation of the individual planar elements 2 in the front and rear areas, as shown in FIG. 1. By elevating only one, the middle planar element 2, all three planar elements 2 can be haptically distinguished with almost uniform homogeneity of the surface.

LIST OF REFERENCE CHARACTERS 1 operating element
2 planar element
3 rotary element
4 cylindrical surface
5 recess
6 circumferential edge
7 palm rest
8 upper surface
9 hand

The invention claimed is:

1. An operating element to be installed in a center console of a motor vehicle, comprising:
   a first planar element and a second planar element which are at least partially touch-sensitive such that an operator can trigger a function via a touch with a hand of the operator or at least one finger of the operator, wherein the first planar element is disposed at a first vertical height, the second planar element is disposed at a second vertical height, and the first vertical height is higher than the second vertical height; and
   a rotary element disposed between the first and second planar elements on a ramp depression in the operating element that extends from the first planar element toward the second planar element and from the first vertical height to the second vertical height, wherein a circumferential grip area of the rotary element is between 180° to 300°;

wherein a cylindrical surface of the rotary element is touch-sensitive.

2. The operating element according to claim 1, wherein the rotary element merges into a palm rest.

3. The operating element according to claim 2, wherein an upper surface of the rotary element and a surface of the palm rest have less than 15 mm height difference.

4. The operating element according to claim 3, wherein the upper surface of the rotary element is touch-sensitive.

5. The operating element according to claim 1, wherein an optic or an acoustic or a haptic feedback is generable by the operating element after the touch.

* * * * *